(12) United States Patent
Baer

(10) Patent No.: US 7,112,774 B2
(45) Date of Patent: Sep. 26, 2006

(54) CMOS STEREO IMAGING SYSTEM AND METHOD

(75) Inventor: Richard L. Baer, Los Altos, CA (US)

(73) Assignee: Avago Technologies Sensor IP (Singapore) Pte. Ltd, singapore (SG)

( * ) Notice: Subject to any disclaimer, the term of this patent is extended or adjusted under 35 U.S.C. 154(b) by 196 days.

(21) Appl. No.: 10/682,708

(22) Filed: Oct. 9, 2003

(65) Prior Publication Data

US 2005/0077450 A1    Apr. 14, 2005

(51) Int. Cl.
*H01L 27/00*    (2006.01)
*G03B 35/00*    (2006.01)
*G06K 9/00*    (2006.01)
*H04N 15/00*    (2006.01)

(52) U.S. Cl. .................... 250/208.1; 396/324; 348/42; 352/57

(58) Field of Classification Search ............ 250/208.1; 348/42, 43, 46, 47, 48; 356/611, 12; 382/154; 352/57; 396/324; 378/41; 355/22
See application file for complete search history.

(56) References Cited

U.S. PATENT DOCUMENTS 5,852,672 A *  12/1998  Lu .............................. 382/154
6,515,271 B1 *   2/2003  Shimizu .................. 250/208.1
6,864,911 B1 *   3/2005  Zhang et al. ................. 348/42

* cited by examiner

*Primary Examiner*—Stephone B. Allen
*Assistant Examiner*—Suezu Ellis

(57) ABSTRACT

A pair of CMOS image sensors is provided. One of the pair of CMOS image sensors is assigned as a master CMOS image sensor and the other is assigned as a slave CMOS image sensor. The slave CMOS image sensor is synchronized to the master CMOS image sensor during image data acquisition. In one embodiment, the master CMOS image sensor and the slave CMOS image sensor are connected to receive a control signal, which assigns the master CMOS image sensor as master and the slave CMOS image sensor as slave. In another embodiment, the master CMOS image sensor and slave CMOS image sensor are hardwired to assign the master and slave. In yet another embodiment, the data signals from the master CMOS image sensor and slave CMOS image sensor are interleaved.

20 Claims, 3 Drawing Sheets

CMOS STEREO IMAGING SYSTEM AND METHOD

TECHNICAL FIELD

The technical field of this disclosure is digital imaging circuits, particularly digital imaging circuits using complementary metal oxide semiconductor (CMOS) imaging sensors to capture stereo pairs and methods of using the same.

BACKGROUND OF THE INVENTION

Stereo imaging uses planar imagers to acquire three-dimensional information about a scene. To obtain the third dimension of depth, two planar imagers are offset by a distance to determine the relative position of objects in the scene. Two types of stereo cameras using conventional cameras with photochemical film as the imager are available. In one, a special offset optics system is used to create two images on a single frame of film by opening a single shutter. In the other, two independent offset cameras with coordinated shutters are used to simultaneously expose two frames of film. Conventional cameras present certain problems as stereo cameras, however. They are complicated, expensive mechanical devices and photochemical film requires the images to be developed and converted to digital data.

The development of charge-coupled device (CCD) image sensors has led to their use in stereo cameras. A CCD image sensor comprises a two-dimensional array of photodiodes which convert received light into a charge. For stereo imaging, two CCD image sensors offset by a distance collect two images using global electronic shutters to synchronize the images. The electronic image data is then read out sequentially. CCD image sensors are expensive in themselves and less than ideal for this application. CCD image sensors require substantial off-chip support circuitry, such as power supplies, device drivers, timing generation, and analog to digital conversion. In addition, CCD image sensors use large amounts of power, requiring large battery capacity in battery-powered devices. This makes CCD-based stereo cameras complicated and expensive.

It would be desirable to have a stereo imaging system and method of using the same that would overcome the above disadvantages.

SUMMARY OF THE INVENTION

The present invention uses low-power CMOS image sensors for stereo imaging. A master CMOS image sensor receives the instruction to acquire an image and synchronizes the operation of a slave CMOS image sensor, so that the master and slave CMOS image sensors acquire their images simultaneously. The master and slave CMOS image sensors are separated by an offset distance so the data from the two-dimensional images can be combined into three-dimensional data.

One aspect of the present invention provides a method for stereo imaging using CMOS image sensors. A pair of CMOS image sensors is provided. One of the pair of CMOS image sensors is assigned as master CMOS image sensor and the other is assigned as slave CMOS image sensor. The slave CMOS image sensor is synchronized to the master CMOS image sensor during image data acquisition.

Another aspect of the present invention provides a system for stereo imaging using CMOS image sensors. The system comprises a master CMOS image sensor connected to receive a control signal, the master CMOS image sensor generating a timing signal; and a slave CMOS image sensor connected to receive the control signal and the timing signal. The timing signal synchronizes the slave CMOS image sensor to the master CMOS image sensor during image data acquisition.

The foregoing and other features and advantages of the invention will become further apparent from the following detailed description of the presently preferred embodiments, read in conjunction with the accompanying drawings. The detailed description and drawings are merely illustrative of the invention, rather than limiting, the scope of the invention being defined by the appended claims and equivalents thereof.

DETAILED DESCRIPTION OF THE PRESENTLY PREFERRED EMBODIMENTS

The invention is based on the observation that the above-described problems arise from difficulties in using CCD image sensors in stereo imaging systems. CCD image sensors require substantial off-chip support circuitry and use large amounts of power, making CCD-based stereo cameras complicated and expensive. CCD image sensors have one advantage for stereo imaging, however. CCD image sensors collect an image over the whole image frame at once using a global shutter, also known as a frame shutter. To synchronize a pair of CCD image sensors in a stereo imaging system, the pair of CCD image sensors only needs to start acquiring data at the same time and have the same exposure settings. Unlike CCD image sensors, CMOS image sensors collect an image a line at a time using a rolling shutter. If one CMOS image sensor in a stereo imaging system is rolling at the top of its frame and the other CMOS image sensor is rolling in the middle of its frame, corresponding lines in the images will be acquired at different times. In accordance with the invention, the rolling shutters of the pair of CMOS image sensors in a stereo imaging system are synchronized to acquire corresponding lines of the images at the same time. This way, movement in the image is not confused with depth information.

Figure 1:
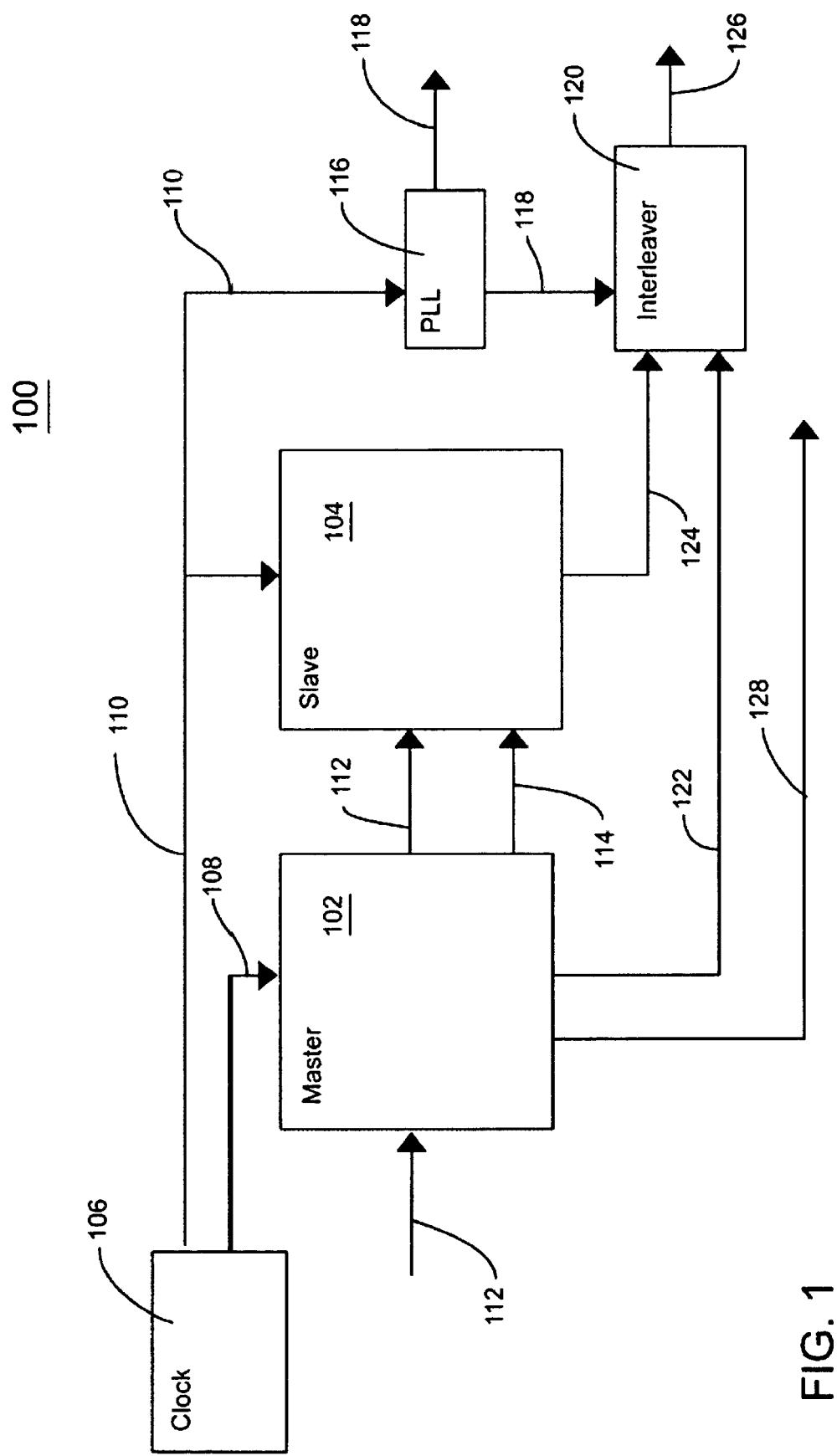
FIGS. 1–2 show block diagrams for stereo imaging systems using CMOS image sensors according to the present invention.
Figure 2:
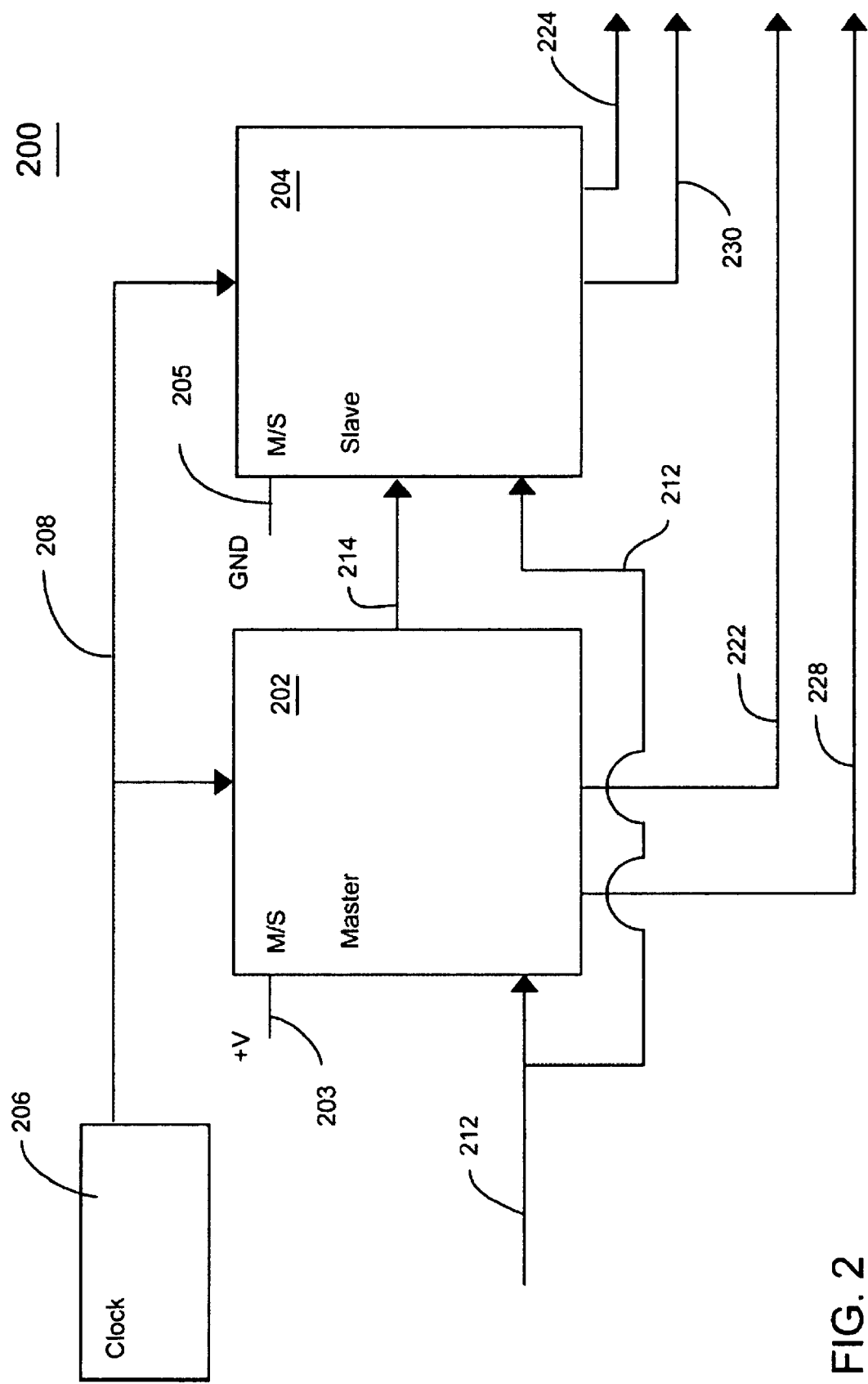

FIGS. 1–2 show block diagrams for stereo imaging systems using CMOS image sensors. Generally, a pair of complementary metal oxide semiconductor (CMOS) imaging sensors is provided. The CMOS image sensors are offset from one another at a distance parallel to the plane in which the CMOS image sensors are arranged. One CMOS image sensor is designated as master and the other is designated as slave. The master CMOS image sensor receives the instruction to acquire an image and synchronizes the operation of the slave CMOS image sensor, so that the master and slave CMOS image sensors acquire their images simultaneously. The CMOS image sensors are synchronized and the image acquisition is simultaneous so that three-dimensional images are obtained without error due to motion of the subjects in the image. The offset distance between the image sensors allows the data from the acquired two-dimensional images to be combined into three-dimensional data.

Referring to FIG. 1, the stereo imaging system 100 includes a master CMOS image sensor 102 and a slave CMOS image sensor 104. A clock 106 provides a first clock signal 108 to the master CMOS image sensor 102 and a second clock signal 110 to the slave CMOS image sensor 104. One example of a CMOS image sensor is the HDCS-1020 CMOS image sensor manufactured by Agilent Technologies, Inc. The CMOS image sensors comprise a photodiode array which acquires image information line-by-line as a narrow exposure interval rolls across the photodiode array. The first clock signal 108 and the second clock signal 110 are opposite phases of the clock 106, so that the slave CMOS image sensor 104 operates with the same timing as the master CMOS image sensor 102 offset by one half of a clock period.

A controller (not shown) provides control signal 112 to the master CMOS image sensor 102 and through the master CMOS image sensor 102 to the slave CMOS image sensor 104. The control signal 112 coordinates and controls operation of the master CMOS image sensor 102 and the slave CMOS image sensor 104. Typically, the control signal 112 is a serial control signal, such as a serial control signal operating under the $I^2C$ (Intelligent Interface Controller) protocol developed by Philips Semiconductor. $I^2C$ uses two wires, a serial data wire and a serial clock wire, to carry information between devices connected to the wires. A unique address is provided for each of the master CMOS image sensor 102 and the slave CMOS image sensor 104. The control signal 112 specifies which CMOS image sensor is the master. The master CMOS image sensor 102 responds to the control signal 112 and also relays the control signal instructions (except the master/slave assignment instructions) to the slave CMOS image sensor 104. This assures that the operation of the slave CMOS image sensor 104 follows the operation of the master CMOS image sensor 102. The control signal 112 additionally includes instructions specifying operation of the CMOS image sensors, such as gain, exposure, and frame size and location on the pixel array.

A timing signal 114 from the master CMOS image sensor 102 forces the slave CMOS image sensor 104 to synchronize with the master CMOS image sensor 102. The timing signal 114 directs the slave CMOS image sensor 104 when to begin a frame and when to begin a line. Because the first clock signal 108 at the master CMOS image sensor 102 and the second clock signal 110 at the slave CMOS image sensor 104 are only offset by one half of a clock period, the image acquisition by the slave CMOS image sensor 104 only lags the image acquisition by the master CMOS image sensor 102 by one half a clock period.

In operation, the master CMOS image sensor 102 and the slave CMOS image sensor 104 receive the control signal 112, which assigns them as master and slave. The control signal 112 assigns operating parameters, such as frame size and location, to the master CMOS image sensor 102, which passes the control signal 112 to the slave CMOS image sensor 104. The timing signal 114 from the master CMOS image sensor 102 forces the line-by-line exposure of the slave CMOS image sensor 104 to synchronize with the exposure of the master CMOS image sensor 102.

In the example shown, the image data from the CMOS image sensors is interleaved to produce a single interleaved output. A phase locked loop (PLL) 116 receives the second clock signal 110 and generates a double speed clock signal 118. The double speed clock signal 118 is provided to an interleaver 120, which interleaves master data signal 122 and slave data signal 124 to produce interleaved data signal 126. The master data signal 122 and slave data signal 124 are typically parallel signals eight or ten bits wide. The data signals are offloaded as read without handshaking, so the receiving circuit must accept data at the rate presented. The line and frame synchronization signals 128 inform the receiving circuit how to interpret the data signals.

The interleaved data signal 126 alternates data from the master and slave CMOS image sensors, so that data on one of the parallel signal paths is MSMSMSMS . . . , where M indicates data from the master data signal 122 and S indicates data from the slave data signal 124. The interleaved data signal 126 delivers twice as much data in a single output as would be delivered at the normal clock rate of clock 106. The interleaved data signal 126 is sent to the receiving circuit (not shown). The synchronization signals 128 and the double speed clock signal 118 are sent to the receiving circuit with the interleaved data signal 126 to coordinate processing of the interleaved data signal 126 by the receiving circuit. In another embodiment, the PLL 116 and the interleaver 120 can be omitted, and the master data signal 122 and slave data signal 124 provided directly to the receiving circuit as two separate signals.

FIG. 2 shows a block diagram of a stereo imaging system using CMOS image sensors. In the stereo imaging system 200, the CMOS image sensors are dedicated as master and slave.

The stereo imaging system 200 includes a master CMOS image sensor 202 and a slave CMOS image sensor 204. The master CMOS image sensor 202 is designated as the master by hardwiring the master/slave selector pin 203 high. The slave CMOS image sensor 204 is designated as the slave by hardwiring the master/slave selector pin 205 low. Because the CMOS image sensors are hardwired as master and slave, the designations are independent of control signal 212. One example of a CMOS image sensor is the HDCS-2020 CMOS image sensor manufactured by Agilent Technologies, Inc. The CMOS image sensors comprise a photodiode array which acquires image information line-by-line as a narrow exposure interval rolls across the photodiode array. A clock 206 provides clock signal 208 to the master CMOS image sensor 202 and the slave CMOS image sensor 204.

A controller (not shown) provides control signal 212 in parallel to the master CMOS image sensor 202 and the slave CMOS image sensor 204. The control signal 212 coordinates and controls operation of the master CMOS image sensor 202 and the slave CMOS image sensor 204. In one embodiment, the control signal 212 operates under the above described $I^2C$ (Intelligent Interface Controller) protocol. The CMOS image sensors are hardwired as master and slave, so that one particular CMOS image sensor is always the master. The master CMOS image sensor 202 responds to the control signal 212 and the slave CMOS image sensor 204 remains as a slave regardless of the instructions contained in the control signal 212. The control signal 212 includes instructions specifying operation of the CMOS image sensors, such as gain, exposure, and frame size and location on the pixel array.

A timing signal 214 from the master CMOS image sensor 202 forces the slave CMOS image sensor 204 to synchronize with the master CMOS image sensor 202. The timing signal 214 directs the slave CMOS image sensor 204 when to begin a frame and when to begin a line. Because the master CMOS image sensor 202 and the slave CMOS image sensor 204 are driven by the common clock signal 208, the image acquisition by the slave CMOS image sensor 204 is synchronized with the image acquisition by the master CMOS image sensor 202. In another embodiment, the timing signal 214 to the slave CMOS image sensor 204 is retarded by a few clock cycles of the clock signal 208 to simplify digital logic design. A one pixel or one line lag between the master CMOS image sensor 202 and the slave CMOS image sensor 204 is sufficient synchronization to provide accurate depth information from the acquired data.

In operation, the master CMOS image sensor 202 and the slave CMOS image sensor 204 receive the control signal 212. The control signal 212 assigns operating parameters, such as gain, exposure, and frame size and location on the pixel array, to the master CMOS image sensor 202 and the slave CMOS image sensor 204. The timing signal 214 from the master CMOS image sensor 202 forces the line-by-line exposure of the slave CMOS image sensor 204 to synchronize with the exposure of the master CMOS image sensor 202.

The master CMOS image sensor 202 and the slave CMOS image sensor 204 generate master data signal 222 and slave data signal 224, respectively, which are provided to a receiving circuit (not shown). The master data signal 222 and slave data signal 224 are typically parallel signals eight or ten bits wide. The data signals are offloaded as read without handshaking, so the receiving circuit must accept data at the rate presented. The synchronization signals 228, 230 inform the receiving circuit how to interpret the data signals.

The examples of FIGS. 1–2 show stereo imaging using a pair of CMOS image sensors, such as used in stereo cameras, but additional CMOS image sensors can be added as desired for particular applications. The master/slave organization of the CMOS image sensors facilitates use of additional CMOS image sensors. The additional CMOS image sensors can be used to provide additional depth information in the plane of the initial pair of CMOS image sensors or can acquire images in other planes. For example, a third CMOS image sensor can be mounted along the same axis of and in the same plane as the initial pair of CMOS image sensors. In another example, a third CMOS image sensor can be mounted off the axis of and in the same plane as the initial pair of CMOS image sensors. In yet another example, additional CMOS image sensors can be mounted outside the plane of the initial pair of CMOS image sensors, such as in the plane perpendicular to the plane of the initial CMOS image sensors. Such arrangements can provide imaging along multiple axes for multiple views and increased precision.

In the embodiment illustrated in FIG. 2, additional CMOS image sensors can be connected by providing the clock signal 208, the control signal 212, and the timing signal 214 to each additional CMOS image sensor. The master/slave selector pin for each additional CMOS image sensor is hardwired low to assign each additional CMOS image sensor as a slave. Each additional CMOS image sensor provides a slave data signal and a data ready signal to the receiving circuit.

Figure 3:
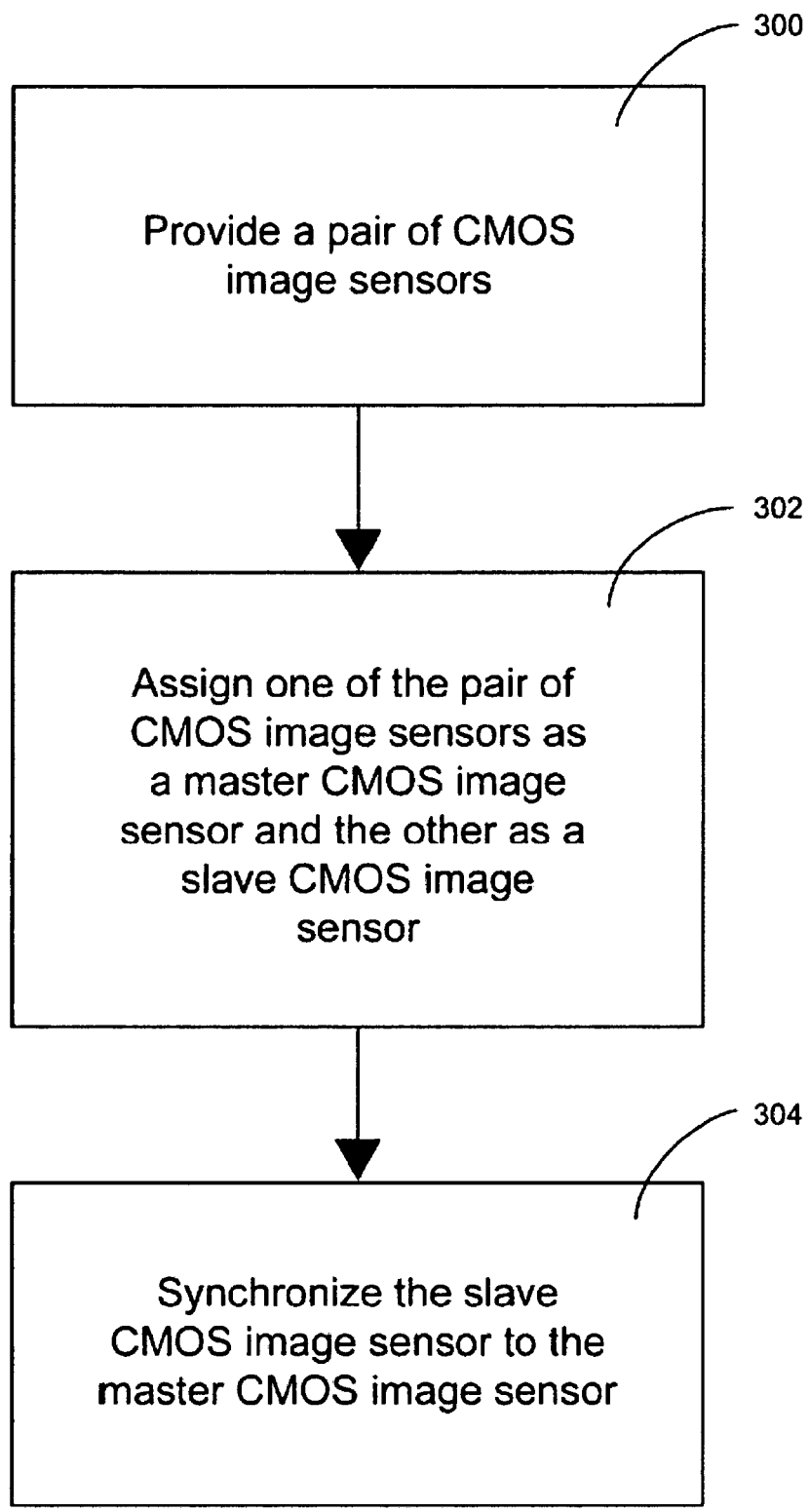
FIG. 3 shows a flow chart of a method for stereo imaging using CMOS image sensors according to the present invention.

FIG. 3 shows a flow chart of a method for stereo imaging using CMOS image sensors. A pair of CMOS image sensors is synchronized to acquire line-by-line image data simultaneously. Typically, the CMOS image sensors are located in the same plane and are offset by a distance to obtain three-dimensional information.

A pair of CMOS image sensors is provided at 300. One of the pair of CMOS image sensors is assigned as a master CMOS image sensor and the other is assigned as a slave CMOS image sensor at 302. The slave CMOS image sensor is synchronized to the master CMOS image sensor at 304. In one embodiment, the CMOS image sensors are assigned as master and slave CMOS image sensors using a control signal. In another embodiment, the CMOS image sensors are assigned as master and slave CMOS image sensors by hardwiring them as master and slave, such as by setting the master/slave selector pin for each CMOS image sensor. In another embodiment, data from the master and slave CMOS image sensors can be interleaved into a single signal. In yet another embodiment, one or more additional CMOS image sensors can be provided and synchronized to the master CMOS image sensor.

The slave CMOS image sensor is synchronized to the master CMOS image sensor by synchronizing timing of the slave CMOS image sensor and the master CMOS image sensor within one line, although the synchronization can be within the timing of one pixel or one-half pixel. Any timing offset that provides three-dimensional imaging without error due to motion of the subjects in the image constitutes "synchronization."

While the embodiments of the invention disclosed herein are presently considered to be preferred, various changes and modifications can be made without departing from the scope of the invention. The scope of the invention is indicated in the appended claims, and all changes that come within the meaning and range of equivalents are intended to be embraced therein.

The invention claimed is:

1. A method for stereo imaging using CMOS image sensors, the method comprising:
   providing a pair of CMOS image sensors;
   assigning one of the pair of CMOS image sensors as a waster CMOS image sensor and the other as a slave CMOS image sensor; and
   synchronizing line-by-line exposure of the slave CMOS image sensor to the master CMOS image sensor during image data acquisition.

2. The method of claim 1, in which the assigning comprises using a control signal to assign the one of the pair of CMOS image sensors as the master CMOS image sensor.

3. The method of claim 1, in which the assigning comprises hardwiring the one of the pair of CMOS image sensors as the master CMOS image sensor and the other of the pair of CMOS image sensors as the slave CMOS image sensor.

4. The method of claim 1, in which the synchronizing comprises synchronizing timing of the slave CMOS image sensor and the master CMOS image sensor within one line.

5. The method of claim 1, additionally comprising:
   generating a master data signal using the master CMOS image sensor;
   generating a slave data signal using the slave CMOS image sensor; and
   interleaving the master data signal and the slave data signal.

6. The method of claim 1, additionally comprising:
   providing at least one additional CMOS image sensor;
   assigning the additional CMOS image sensor as an additional slave CMOS image sensor; and
   synchronizing the additional CMOS image sensor so the master CMOS image sensor.

7. A system for stereo imaging using CMOS image sensors, the system comprising:
   a master CMOS image sensor connected so receive a control signal, the master CMOS image sensor generating a timing signal; and
   a slave CMOS image sensor connected to receive the control signal and the timing signal;

wherein the timing signal synchronizes line-by-line exposure of the slave CMOS image sensor to the master CMOS image sensor during image data acquisition.

8. The system of claim 7, in which the control signal is a serial control signal and additionally assigns the waster CMOS image sensor as master and the slave CMOS image sensor as slave.

9. The system of claim 7, additionally comprising a clock generating a first clock signal and a second clock signal offset in phase from the first clock signal, wherein the master CMOS image sensor is connected to receive the first clock signal and the slave CMOS image sensor is connected to receive the second clock signal.

10. The system of claim 9, in which:
the master CMOS image sensor generates a master data signal;
the slave CMOS image sensor generates a slave data signal;
the system additionally comprises:
a phase locked loop (PLL) connected to receive the second clock signal and generating double speed clock signal; and
an interleaver connected to receive the master data signal, the slave data signal, and the double speed clock signal, the interleaver generating an interleaved data signal.

11. The system of claim 7, in which the master CMOS image sensor and the slave CMOS image sensor are serially connected to receive the control signal.

12. The system of claim 7, in which the master CMOS image sensor comprises a first master/slave pin hardwired to assign the master CMOS image sensor as master and the slave CMOS image sensor comprises a second master/slave pin hardwired to assign the slave CMOS image sensor as slave.

13. The system of claim 7, additionally comprising a clock generating a clock signal, wherein the master CMOS image sensor and the slave CMOS image sensor are connected to receive the clock signal.

14. The system of claim 7, in which the master CMOS image sensor and the slave CMOS image sensor are connected in parallel to receive the control signal.

15. The system of claim 7, in which the control signal is a serial control signal comprising an $I^2C$ (Intelligent Interface Controller) protocol signal.

16. The system of claim 7, in which the timing signal synchronizes timing of the slave CMOS image sensor and the master CMOS image sensor within one line.

17. The system of claim 7, additionally comprising at least one additional slave CMOS image sensor connected to receive the control signal and the timing signal.

18. A system for stereo imaging using CMOS image sensors, the system comprising:
a pair of CMOS image sensors;
means for assigning one of the pair of CMOS image sensors as a master CMOS image sensor and for assigning the other of the pair of CMOS image sensors as a slave CMOS image sensor; and
means for synchronizing line-by-line exposure of the slave CMOS image sensor to the master CMOS image sensor during image data acquisition.

19. The system of claim 18, in which:
the master CMOS image sensor generates a master data signal;
the slave CMOS image sensor generates a slave data signal; and
the system additionally comprises:
an interleaver connected to receive the master data signal and the slave data signal, the interleaver generating an interleaved data signal.

20. The system of claim 18, additionally comprising:
at least one additional CMOS image sensor;
means for assigning the additional CMOS image sensor as an additional slave CMOS image sensor; and
means for synchronizing the additional CMOS image sensor to the master CMOS image sensor.

* * * * *